US006441764B1

(12) United States Patent
Barron et al.

(10) Patent No.: US 6,441,764 B1
(45) Date of Patent: Aug. 27, 2002

(54) HYBRID ANALOG/DIGITAL SIGNAL CODING

(75) Inventors: Richard Barron, Cambridge; Alan V. Oppenheim, Lexington, both of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/565,102

(22) Filed: May 5, 2000

Related U.S. Application Data

(60) Provisional application No. 60/132,776, filed on May 6, 1999.

(51) Int. Cl.[7] .................................... H03M 1/12

(52) U.S. Cl. .................. 341/155; 375/141; 375/240.11

(58) Field of Search .................. 341/155, 50, 118, 341/126; 375/141, 240.11, 146, 147

(56) References Cited

U.S. PATENT DOCUMENTS

| | | | | |
|---|---|---|---|---|
| 4,969,040 A | * 11/1990 | Gharavi | 375/240.11 |
| 5,127,021 A | * 6/1992 | Schreiber | 375/141 |
| 5,311,543 A | * 5/1994 | Schreiber | 375/141 |
| 5,408,530 A | * 4/1995 | Makino et al. | 379/392 |
| 5,425,050 A | * 6/1995 | Schreiber et al. | 375/141 |
| 5,451,954 A | * 9/1995 | Davis et al. | 341/200 |
| 5,521,946 A | * 5/1996 | Main | 375/350 |
| 5,550,859 A | * 8/1996 | Seshadri | 375/216 |
| 5,617,219 A | * 4/1997 | Oikawa | 386/111 |
| 5,682,152 A | * 10/1997 | Wang et al. | 341/50 |

OTHER PUBLICATIONS

XP–002144069; 1999 IEEE Workshop on Applications of Signal Proccessing to Audio and Acoustics, New Paliz, New York; Oct. 17–20, 1999; "A Systematic Hybrid Analog/Digital Audio Coder" by Barron et al., pp.: 35–38.

XP–000199121; "Audio Compression At Low Bit Rates Using A Signal Adaptive Switched Filterbank"; by Sinha et al., pp. 1053–1056; AT&T Bell Labs; Murray Hill, NJ; 07974.

XP–002144070; IEEE Transactions on Information Theory; vol. 44, No. 2, Mar. 1998; "Systematic Lossy Source/Channel Codin" by Shamai et al., pp. 564–579.

XP–000834308; IEEE Transactions On Broadcasting, vol. 44, No. 1, Mar., 1998; "An OFDM All Digital In–Band–On–Channel (IBOC) AM and FM Radio Solution Using the PAC Encoder"; by Cupo et al., pp. 22–27.

* cited by examiner

*Primary Examiner*—Peguy JeanPierre
*Assistant Examiner*—Jean Bruner JeanGlaude
(74) *Attorney, Agent, or Firm*—Samuels, Gauthier & Stevens, LLP

(57) ABSTRACT

An apparatus and method for subband signal coding, using algorithms of comparable complexity to conventional coders, that exploits a noisy analog signal at the decoder. It is assumed that the analog signal is the output of a channel through which the source is sent uncoded. By using the analog signal at the receiver, the required digital bit rate is able to be reduced while offering comparable fidelity to conventional coding systems that ignore the analog signal. Concepts from conventional subband coding, e.g., subband decomposition, quantization, bit allocation, and lossless bitstream coding, are tailored to exploit the analog signal at the receiver such that frequency-weighted mean-squared error (MSE) is minimized. Because subband coefficients are coded, all results pertaining to perceptual masking are easily applied to this method of coding. The invention is directed to a signal coding solution for a hybrid channel that is the composition of two channels: a noisy analog channel through which a signal source is sent unprocessed and a secondary rate-constrained digital channel. The source is processed prior to transmission through the digital channel.

18 Claims, 6 Drawing Sheets

| Lattice | Symbol |
|---|---|
| 0 | ○ |
| 1 | △ |
| 2 | □ |
| 3 | × |

| Analog Channel SNR ( dB ) | Bit Rate ( kb/sec ) |
|---|---|
| 10 | 25-55 |
| 20 | 15-25 |
| 30 | 10-20 |

HYBRID ANALOG/DIGITAL SIGNAL CODING

PRIORITY INFORMATION

This application claims priority from provisional application Ser. No. 60/132,776 filed May 6, 1999.

This invention was made with government support under Grant No. F49620-96-0-0072 awarded by the Air Force and Contract Number DAAL01-96-2-0001 awarded by the Army. The government has certain rights in the invention.

BACKGROUND OF THE INVENTION

The invention relates to the field of signal coding in a hybrid channel.

In some source coding scenarios, there exist observations of signals at the decoder that are correlated with the source which may be used jointly with a digital representation to reconstruct the source. For example, in the case of in-band on-channel (IBOC) digital audio broadcast (DAB), an existing noisy analog communications infrastructure may be augmented by a low-bandwidth digital side channel for improved fidelity. As another example, in a two-sensor scenario, one sensor may observe a distorted full-bandwidth form of the source signal, while the other observes the source undistorted but can only record or transmit a low-bandwidth representation of the signal. A final example is a source coding scheme that devotes a fraction of available bandwidth to the analog source and the rest of the bandwidth to a digital representation. This scheme is applicable in a wireless communications environment, where analog transmission has the advantage of a gentle "roll-off" of fidelity with SNR.

The basic model representing such systems, which is referred to as the "hybrid channel", is illustrated in FIG. 1. The hybrid channel consists of a noisy analog channel 102, through which a signal source 104 is sent unprocessed, and a secondary rate-constrained digital channel 106. The source is processed by an encoder 108 prior to transmission through the digital channel. A receiver 110 estimates the source from both the analog and digital data. It is assumed that no processing is performed prior to transmission over the analog channel 102. Any form of modulation, such as amplitude or frequency modulation, is assumed to be part of the analog channel model.

SUMMARY OF THE INVENTION

The invention provides an apparatus and method for subband signal coding, using algorithms of comparable complexity to conventional coders, that exploits a noisy analog signal at the decoder. It is assumed that the analog signal is the output of a channel through which the source is sent uncoded. By using the analog signal at the receiver, the required digital bit rate should be able to be reduced while offering comparable fidelity to conventional coding systems that ignore the analog signal. In the DAB scenario, broadcasters can use the bits saved on audio source coding either for improved error-correction or transmission of non-audio data.

The term "systematic" has been used to describe source coding with analog information at the receiver as an extension of a concept from error-correcting channel codes. A systematic error-correcting code is one whose codewords are the concatenation of the uncoded information source string and a string of parity-check bits. Similarly, in the systematic hybrid source coding scenario, there is an uncoded analog transmission and a source-coded digital transmission.

In accordance with the invention, concepts from conventional subband coding, e.g., subband decomposition, quantization, bit allocation, and lossless bitstream coding, are tailored to exploit the analog signal at the receiver such that frequency-weighted mean-squared error (MSE) is minimized. Because subband coefficients are coded, all results pertaining to perceptual masking are easily applied to this method of coding. In addition, the techniques of the invention require very little additional overhead as far as source side information. Although the results are applicable to coding of all signals, the application of these digital coding techniques to the perceptual coding of audio as a solution to the DAB problem is emphasized. Using a 30 dB analog signal corrupted by additive white Gaussian noise at the decoder, bit rates as low as 10 to 20 kbits/sec are attainable for transparent coding of mono audio sampled at 44.1 kHz.

The invention is directed to a signal coding solution for a hybrid channel that is the composition of two channels: a noisy analog channel through which a signal source is sent unprocessed and a secondary rate-constrained digital channel. The source is processed prior to transmission through the digital channel. Signal coding solutions for this hybrid channel are clearly applicable to the in-band on-channel (IBOC) digital audio broadcast (DAB) problem. A perceptually-based subband audio coder is provided, with complexity comparable to conventional coders, that exploits a signal at the receiver of the form $y[n]=g[n]*x[n]+u[n]$, where $x[n]$, $g[n]$, and $u[n]$ denote respectively the source, the impulse response of convolutional distortion, and additive Gaussian noise.

Accordingly, in one exemplary embodiment the invention provides a systematic hybrid analog/digital encoder, and corresponding method of encoding, which processes data including an analog source signal which is transmitted on an analog channel and a digital source signal whose digital encoding is transmitted on a digital channel, the digital source signal being a discrete-time sampled signal of the analog source signal. The encoder comprises an analysis filter bank which performs a subband decomposition of the digital source signal to generate a plurality of subband source signals; a quantizer which processes the plurality of subband source signals, based on characteristics associated with the analog channel and the characteristics associated with the digital source signal, to generate a plurality of quantizer output levels represented by a sequence of bits; a lossless bitstream coder which processes the sequence of bits as a function of the analog channel characteristics and the digital source signal characteristics, to generate an output coded bitstream; and a bitstream formatter which integrates the coded bitstream with supplementary data associated with the subband source signals.

In another exemplary embodiment, the invention provides a systematic hybrid analog/digital decoder which processes data received from analog and digital channels, the analog channel having an analog output signal related to an analog source signal, and the digital channel having a formatted bitstream derived from a digital source signal. The decoder comprises a bitstream interpreter which reads the bitstream and determines a coded bitstream and supplementary data associated with a plurality of subband source signals derived from the digital source signal; an analog estimator that processes the analog output signal based on characteristics associated with the analog channel and characteristics associated with the digital source signal, to generate a plurality of subband signal estimates; a bitstream decoder which decodes the coded bitstream based on the analog output signal, characteristics associated with the analog channel, and characteristics associated with the digital source signal, to generate a plurality of quantizer output levels; a subband signal generator which generates a plurality of reconstructed subband signals based on the subband signal estimates and the quantizer output levels; and a reconstructed source generator which generates a reconstructed digital source signal by processing the reconstructed subband signals with a synthesis filter bank.

DETAILED DESCRIPTION OF THE INVENTION

Figure 2:
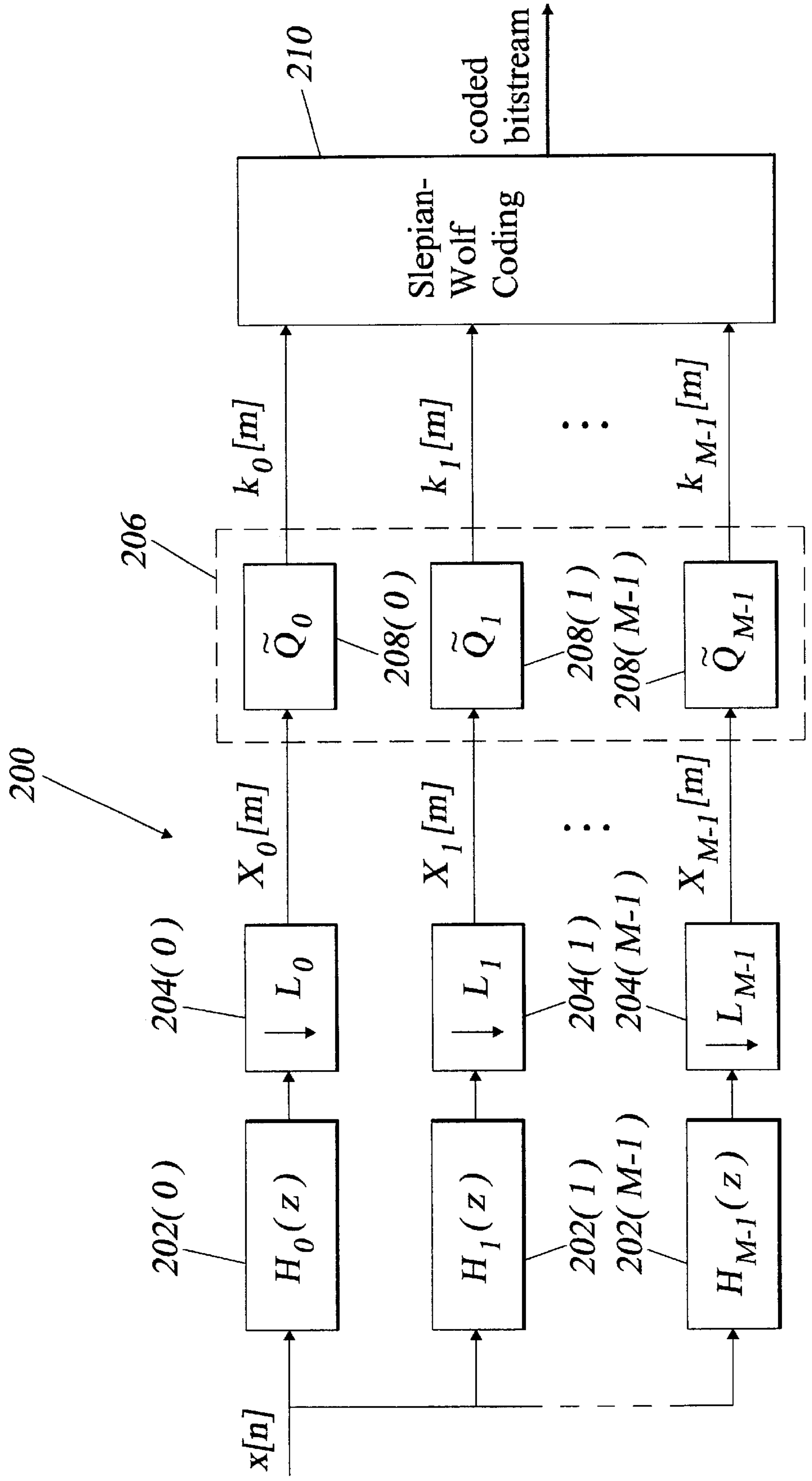
FIG. 2 is a schematic block diagram of an exemplary digital encoder in accordance with the invention.
Figure 3:
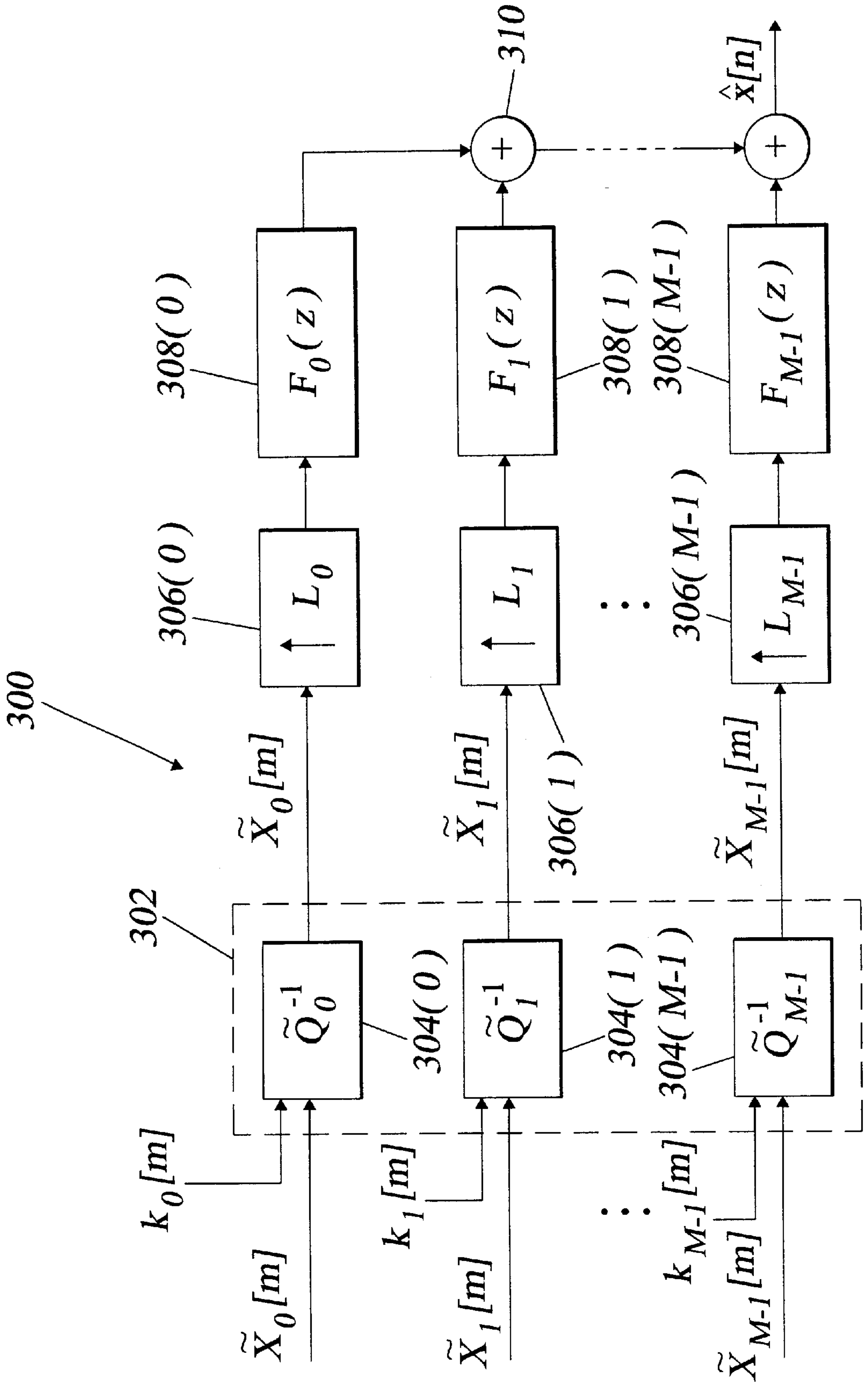
FIG. 3 is a schematic block diagram of an exemplary hybrid decoder in accordance with the invention.

In describing the invention now with reference to FIGS. 2 and 3, it will be assumed that the source is some colored Gaussian sequence x[n] and the analog observation is y[n]=g[n]*x[n]+u[n], where g[n] is the impulse response of some convolutional distortion and u[n] is additive Gaussian noise, which is independent from the source and may be colored. These assumptions will assist in analysis, but the system design can be applied to general sources and a broad class of additive noise. The assumption that audio is approximately Gaussian has been successfully applied to a number of problems in audio processing. The Gaussian channel model very accurately represents the AM channel and closely approximates the FM channel in the high SNR case.

FIG. 2 is a schematic block diagram of an exemplary digital encoder 200 in accordance with the invention. The encoder includes a series of analysis filters 202(0)–202(M−1) and a series of associated downsamplers 204(0)–204(M−1). A vector quantizer 206 is provided, which can take the form of a series of scalar quantizers 208(0)–208(M−1), and can operate across subbands and/or across frames. A coding module 210 is provided for carrying out Slepian-Wolf coding to generate the coded bitstream.

FIG. 3 is a schematic block diagram of an exemplary hybrid decoder 300 in accordance with the invention. The decoder includes a vector reconstruction module 302 that can take the form of a series of scalar quantizer reconstruction functions 304(0)–304(M−1), which serve as reconstruction functions of the subband coefficients based on the analog and digital data. A series of upsamplers 306(0)–306(M−1) and associated filters 308(0)–308(M−1) are also provided. The outputs of the filters 308 are summed at a summation module 310. The signal $\tilde{X}_i[m]$ is an estimate of the subband signal $X_i[m]$ based on the observation of the output of the analog channel y[n].

Figure 4:
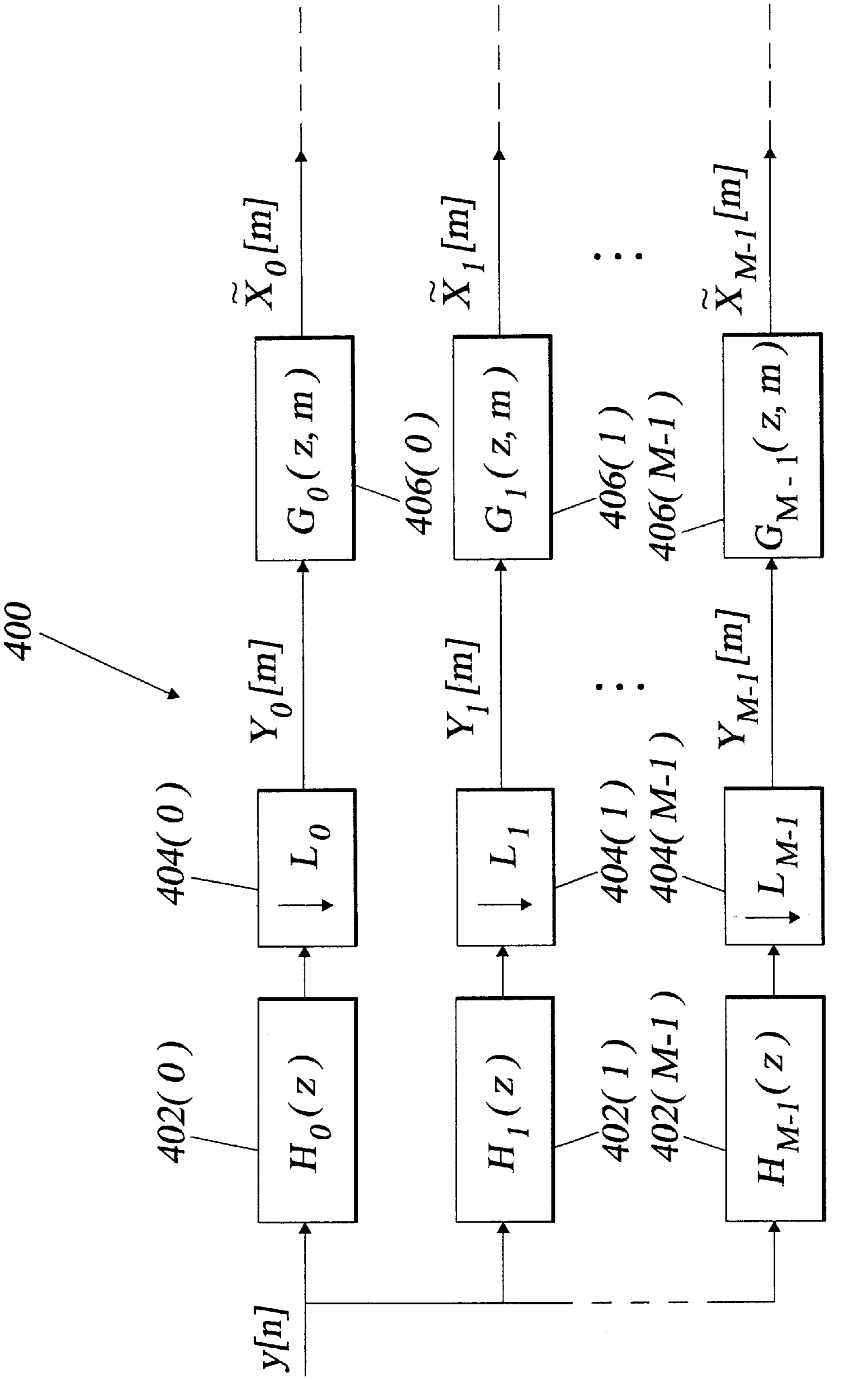
FIG. 4 is a schematic block diagram of an exemplary embodiment of a subband signal estimator in accordance with the invention.

FIG. 4 is a schematic block diagram of an exemplary embodiment of a subband signal estimator 400 based on y[n]. The estimator includes a series of analysis filters 402(0)–402(M−1) that are used in the encoder 200 and associated downsamplers 404(0)–404(M−1). Filters 406(0)–406(M−1) ($G_i(z,m)$) are the optimal time-varying linear estimation filters used to estimate subband signal $X_i$. The filters are derived from source statistics and the channel model, which assumes convolutional distortion and additive noise. The filters $G_i(z,m)$ may be approximated by a time-varying gain $p_i[m]$.

The decoder 300 has some additional complexity induced by the incorporation of the analog information into the estimate. As with conventional coding, systematic hybrid coding is composed of three essential elements: an analysis/synthesis filter bank, quantization, and bitstream coding. The encoder 200 and decoder 300 include each of these elements. The bitstream coding for the hybrid scenario employs Slepian-Wolf codes, a concept not seen in conventional source coding. It is necessary to format the bitstream for transmission over the digital channel. As will be appreciated by those skilled in the art, the formatted bitstream will include two primary components: coded quantized subband values and source side information to facilitate decoding, e.g., the time-varying spectral envelope.

The hybrid encoder 200 operates on the basic premise of subband coding. The source signal x[n] is decomposed by a filter bank into a set of M subband signals $\{X_i[m]\}_{i=0}^{M-1}$, which are subsequently coded (quantized) for the particular bit rate allowed by the digital channel. A particular filter bank is described by its analysis filters, denoted by $\{H_i(z)\}_{i=0}^{M-1}$ in FIG. 2, and corresponding synthesis filters at the decoder 300, denoted by $\{F_i(z)\}_{i=0}^{M-1}$. The synthesis bank takes the subband signal estimates $\{ X_i[m] \}_{i=0}^{M-1}$, derived from the analog and digital data, and creates a time domain signal estimate, $\hat{x}[n]$.

In general, a given analysis filter 202(*i*) output is downsampled by a factor L, and the corresponding synthesis filter 302(*i*) is upsampled by the same factor. The value L may be greater, less than, or equal to the number of analysis filters M. For coding applications best performance is usually achieved when L equals M for all filters, a condition referred to as critical sampling, which implies the number of samples into the filter bank is equal to the number of samples out. The term n is used to denote the index for the original source and the index m to denote the time index for the (decimated) subband signals. If the filter bank is implemented by a transform like the modified discrete cosine transform (MDCT), each index m corresponds to a windowed frame of signal data. Therefore, the nomenclature "frame" is used to refer to a particular index m.

There exists a wealth of results on the design of filter banks for a variety of signal processing tasks. For use in conventional signal coding, a filter bank usually satisfies several criteria. First, the filter bank is perfect reconstruction, so that in the absence of any quantization of subband signals, the source can be reconstructed exactly using the matching synthesis filter bank. Secondly, a strong stopband rejection is desired for each synthesis filter so that any noise injected into the system by quantization will not affect neighboring subbands significantly. Finally, the filter bank should be implementable by fast algorithms, usually involving the FFT, to minimize algorithmic complexity of the encoder.

The MDCT satisfies these criteria nicely, and is used in many state of the art transform audio coders. In the sense of maximum coding gain, a good filter bank for conventional source coding is also a good filter bank for coding with analog information at the decoder. In order to alleviate time-domain artifacts such as pre-echo, many state of the art audio coders use signal-dependent switched filter banks. These filter banks may also be used for systematic hybrid audio coding, but the initial implementation of the invention uses a fixed filter bank. Note that for switched filter banks, the analysis and synthesis filters will be time varying; the filters will be denoted $H_i(z,m)$ and $F_i(z,m)$, respectively.

The encoder 200 must quantize the subband coefficients under a bit rate constraint, anticipating that the decoder 300 will have access to analog information correlated to the source. As shown in FIG. 2, $\{\tilde{Q}_i[\cdot]\}_{i=0}^{M-1}$ denote the bank of hybrid quantizers that encode the subbands. For much of the remainder of this description, the indices i and m will be omitted as they will be considered implicit.

For systematic hybrid coding, quantizer structures that have complexity comparable to conventional quantizers are used. In general, vector quantizers can be used, but they impose significant costs in terms of complexity and latency. Vector quantization implies grouping samples across frames and/or across subbands, and quantizing that group. If attention is restricted to scalar quantization of subband coefficients, complexity and latency is significantly reduced. Using scalar quantizers is sensible in that if scalar quantization is done followed by Slepian-Wolf coding, the theoretical limit of performance can be approached (the rate-distortion function) to within 0.255 bit/sample.

Simply the composition of a modulo operation and a conventional uniform quantizer, the quantizer utilized for the hybrid scenario, $\tilde{Q}(X)$, is given by:

$$\tilde{Q}(X) = Q(X \bmod W) \tag{1}$$

$$Q(v) = k,\ \frac{kW}{k} \le v + \frac{W}{2} < \frac{(k+1)W}{K} \quad k = 0, 1, \ldots, K-1, \tag{2}$$

where K is the number of levels allocated to the quantizer. In general, for every index $k \in \{0,1, \ldots, K-1\}$, a quantizer design can be chosen such that the domain $\{X|\tilde{Q}(X)=k\}$, is any arbitrary set. However, the modulo-uniform quantizers very closely approximate the optimal scalar hybrid quantizers with respect to mean-squared error. The determination of appropriate values for K for each of the subbands is described with reference to the bit allocation hereinafter.

Figure 5:
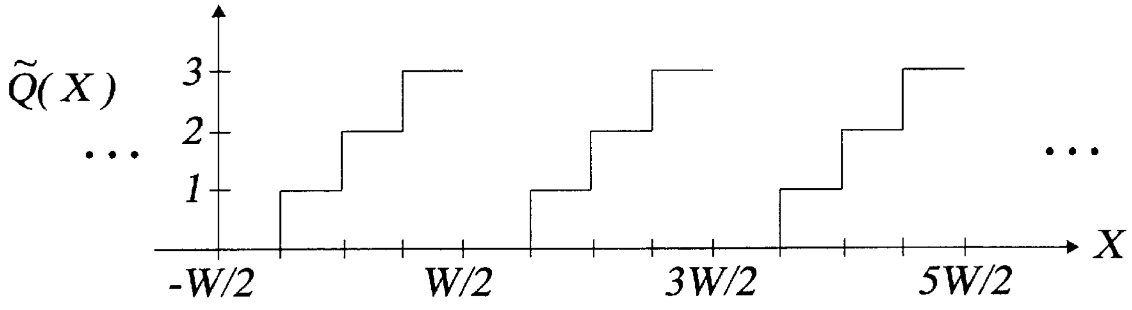
FIG. 5 is a graph showing hybrid quantization ($\tilde{Q}(X)$) for a 2-bit quantizer with modulo uniform quantizers.

FIG. 5 is a graph showing hybrid quantization ($\tilde{Q}(X)$) for a 2-bit quantizer with modulo uniform quantizers. The plot is a cascade of staircases, where W is the width of each staircase. A cell is the interval described by a step of the staircase, and its width is given by $\Delta=W/K$. Each quantizer level $k\Delta\{0,1, \ldots, K-1\}$ is the image of the union of several disjoint cells, rather than just one cell.

Figure 6:
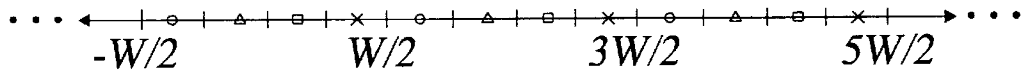
FIG. 6 is a graph of lattice interpretation of hybrid quantization.

The quantizer $\tilde{Q}(X)$ may also be interpreted in terms of a collection of interleaved lattices, $\{L_i\}_{i=0}^{K-1}$. To each quantizer output $k=\tilde{Q}(X)$, a lattice $L_k$, as shown in FIG. 6, is assigned with lattice points uniformly separated by length W. FIG. 6 is a graph of lattice interpretation of hybrid quantization. Each lattice point is the center of a cell region defined by the function $\tilde{Q}$. Each successive lattice is the previous lattice shifted by $\Delta$ units. An alternative description of Q(X) in terms of lattices is as follows. The function Q(X) is the index of the lattice that contains the lattice point closest in Euclidean distance to X. The lattice interpretation is useful to describe the reconstruction of subband coefficients from k=Q(X) and the analog signal, a procedure described hereinafter.

In order to determine a good value for the staircase width W for the quantizers, attention is focused on the operation of the decoder 300. At the first stage of the decoder an estimate is derived, $\tilde{X}$, based on y[n] of each of the subband coefficients X. Although any estimate in general may be used, using an estimate that achieves minimum mean-squared error (MMSE) so that the subband signal will be known with greatest certainty is suggested. An exemplary embodiment of the estimator 400 that closely approximates a MMSE estimator is shown in FIG. 4. The analog signal y[n] is decomposed into subbands $Y_i[m]$ by the same analysis bank as at the encoder 200. The subband decomposition approximately orthogonalizes the source samples and the noise samples in a given frame. Therefore, MMSE estimation of X only requires the signal $Y_i[m]$ and the digital index k from the encoder. Estimation is simply performed by filtering $Y_i[m]$ with a time-varying estimation filter $G_i(z,m)$. The filter is derived from source statistics and the channel model that assumes convolutional distortion and additive noise. Although not depicted in FIG. 4, the hybrid analog/digital reconstruction $\tilde{X}$ can be fed back to aid in estimation of X.

Given that y[n]=g[n]*x[n]+u[n], where g[n] is a real, even filter, a given subband signal Y is closely approximated by Y=hX+U where h is a known gain, and U is an additive Gaussian noise variable. Using this $G_i(z,m)$ can be closely approximated by a simple gain $\rho_i[m]$. Representing convolutional distortion by a constant gain for each subband is a valid approximation. If more accuracy is desired, it will be appreciated that for appropriate choice of analysis and synthesis filters, convolution may be implemented by low order filters on each subband signal. Using this more accurate model, the $G_i(z,m)$ filters will be filters that in general have order greater than zero.

For the remainder of the description, it will be assumed that each frame is processed independently, which implies that the filters $G_i(z,m)$ are given by the gain $\rho_i[m]$. The results extend obviously to the case where the $G_i(z,m)$ filters are general time varying filters. Let $\sigma_X^2$ and $\sigma_U^2$ be the variances of X and U, respectively. Given that the subband decomposition approximately orthogonalizes the source samples and the noise samples in a given frame, the minimum mean-squared error (MMSE) estimate, $\tilde{X}$, of subband coefficient X from a frame of y[n] is $\rho Y$, simply a gain times the analog subband coefficient. The value $\rho$, shown in FIG. 3 at the decoder, is the correlation coefficient between X and Y, $$\rho = \frac{h\sigma_X^2}{h^2\sigma_X^2 + \sigma_U^2}$$

The error in the estimate is given by $e=X-\tilde{X}$, and the error variance is given by:

$$\sigma_e^2 = \frac{\sigma_X^2\sigma_U^2}{h^2\sigma_X^2 + \sigma_U^2} \tag{3}$$

Given the analog observation Y, the MMSE variance $\sigma_e^2$ is constant and is always less than the source variance, $\sigma_X^2$. This is also true for the case where the $G_i(z,m)$ filters are general time varying filters. The expression for the error variance is only slightly different. Let $W=C\sigma_e$, for some constant C>1, so that a single staircase will contain the region of support for the MMSE error. In the absence of any Slepian-Wolf coding, C≈7 is the near-optimal value for C for the typical range of operation in an audio application. The source variance, noise variance, and gain h in a given subband must be known in order to calculate W. Typically, the values $\sigma_U^2$ and h are usually given by some known channel model. The variance of the source, however, must be communicated as side information in the digital bit stream, perhaps in some low-bandwidth parametric form. This information is sent as side information to specify bit allocation across subbands, so the analog estimation stage requires no additional overhead.

The index k that is output from the quantizer $\tilde{Q}$ is sent to the decoder, where it is used jointly with the analog signal y[n] to reconstruct the subband coefficient X. As shown in FIG. 3, the reconstruction function for each subband is denoted $\tilde{Q}^{-1}(k,\tilde{X})$, and it requires the estimate $\tilde{X}$ in addition to the index k from the encoder as input. The reconstruction function provides an improved estimate $\hat{X}$ of the subband coefficient X.

Figures 7, 8:
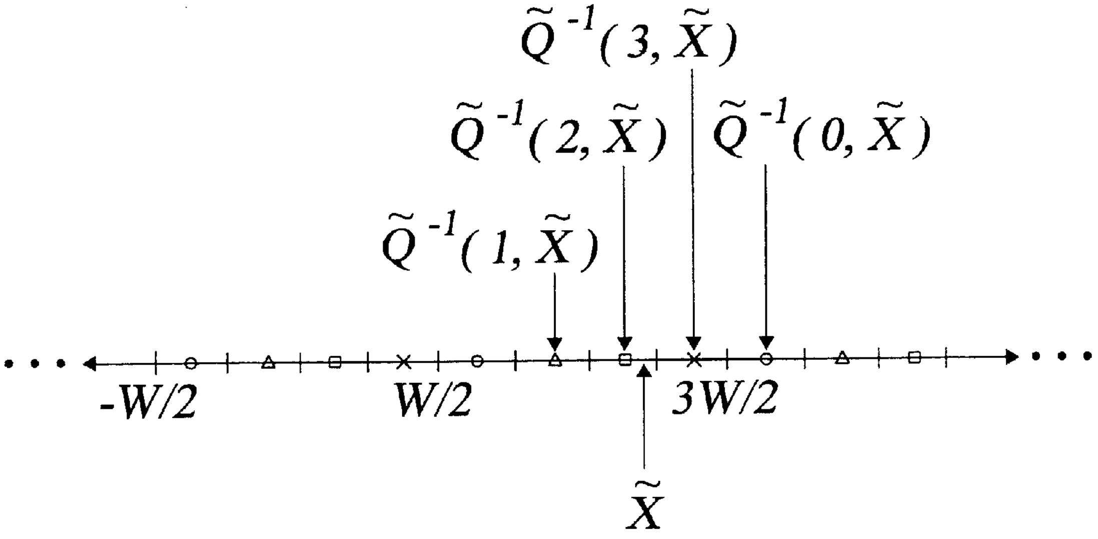
FIG. 7 is a graph of a an exemplary embodiment of a reconstruction function, for a 2-bit quantizer.
FIG. 8 is a table of the required bit rate for transparent audio given analog channel output at certain SNR.

FIG. 7 is a graph of an exemplary embodiment of a reconstruction function, for a 2-bit quantizer, given that a modulo-uniform quantizer is used at the encoder. The function is implemented as follows. The index $k=\tilde{Q}(X)$ from the encoder defines a particular uniform lattice $L_k$. The reconstructed subband signal $\hat{X}=\tilde{Q}^{-1}(k,\tilde{X})$ is the lattice point of $L_k$ that is the minimum Euclidean distance from $\tilde{X}$. This minimum-distance reconstruction rule closely approximates the rule for MMSE reconstruction. If more accuracy is desired, a probabilistic reconstruction rule based on apostiori statistics yields the exact MMSE reconstruction.

The design of the reconstruction function depends on the chosen method for quantization and the exact form of the estimate $\tilde{X}$. For example, if vector quantization across subbands and/or frames is used, the $\tilde{Q}_i^{-1}$ reconstruction functions will be functions several subband estimates and/or several frame samples.

Due to digital bandwidth constraints, a particular number of bits B are allocated for a frame of audio data. The bit allocation problem addresses the allocation of $b_i$ bits to each scalar quantizer $\tilde{Q}_i$ such that a weighted error is minimized and $\Sigma_i b_i=B$. Variable rate coders vary bit rates from frame to frame. The procedure to determine the allocation of bits across frames are not described herein, as methods from conventional coding extend obviously to the hybrid encoder.

Initially, the bit allocation for the coding of generic signals will be described, and thereafter how the algorithm is modified for audio when perceptual weighting is taken into account. Considering weighted error, a time-varying weighting function $W_i[m]$, i=0,1, . . . , M−1, is defined as a function of subband frequency and frame number. If minimum mean-squared error is desired, $W_i$ is set to be a constant as a function of i. Bits are allocated according to an algorithm that implements an inverse water-pouring procedure. One may use any of several inverse-waterpouring methods; the invention utilizes one simple procedure.

The frame starts with a reservoir of B bits. Initially, each subband has an associated weighted analog estimation error $W_i\sigma_{e_i}^2$. Select the subband with the largest error, and allocate one bit, which reduces the error in the subband by some known amount. It is straightforward to determine how much the error is reduced by adding one more bit to a subband description. Roughly, the error is reduced by 6 dB per bit, which is a well-known rule of thumb from conventional signal coding. After each bit assignment, decrement the number of bits in the bit reservoir by 1. Continue allocating bits to the critical bands with the largest remaining error until the reservoir is empty. This algorithm closely approximates the optimal bit allocation procedure with respect to weighted mean-squared error.

The considerable coding gains attained by most state of the art audio coders may be attributed to bit allocation based on a signal-dependent masking threshold referred to as the just-noticeable-distortion (JND) level. In the hybrid encoding scenario, use of perceptual masking is as straightforward as in conventional coding. The JND may be calculated by one of several methods outlined in the research literature. Based on models for human hearing, the JND usually is calculated as a function of Bark frequency. In order to implement algorithms on a Bark frequency scale, blocks of adjacent subbands are grouped into critical bands where the critical band bandwidths increase roughly logarithmically with frequency. Let $M_{CB}$ be the number of critical bands, and let $J_i[m]$, i=0,1, . . . , $M_{CB}-1$ denote the JND function.

The JND is most often calculated as a function of two variables for each subband: source variance and level of tonality or noise-like character. Since the source variance is sent to facilitate the analog estimation stage, this information is already provided to the decoder. Bits are allocated according to an inverse water-pouring procedure. At each step of the algorithm, bits are allocated to a critical band as opposed to a subband in the case of generic signal coding. Again one may use any of several inverse-waterpouring methods, and the invention utilizes one simple embodiment. The frame starts with a reservoir of B bits. Initially, each critical band has an associated weighted analog estimation error $(\sigma_{e_i}^2)_{CB}/J_i[m]$, where $(\sigma_{e_i}^2)_{CB}$ is simply the sum of the mean-squared estimation errors in the subbands contained in critical band i. Select the critical band with the largest error, and give one bit to each subband in that critical band, which reduces the error in a subband by some known amount. Again, it is straightforward to determine how much the error is reduced by adding one more bit to a subband description. After each bit assignment, decrement the number of bits in the bit reservoir by the number of subbands to which bits were allocated. Continue allocating bits to the critical bands with the largest remaining error until the reservoir is empty. If the number of bits B in the reservoir is large enough for every frame of audio, perceptual transparency (CD-quality audio) is achieved when the mean-squared error in every critical band is less than the JND.

Figure 1:
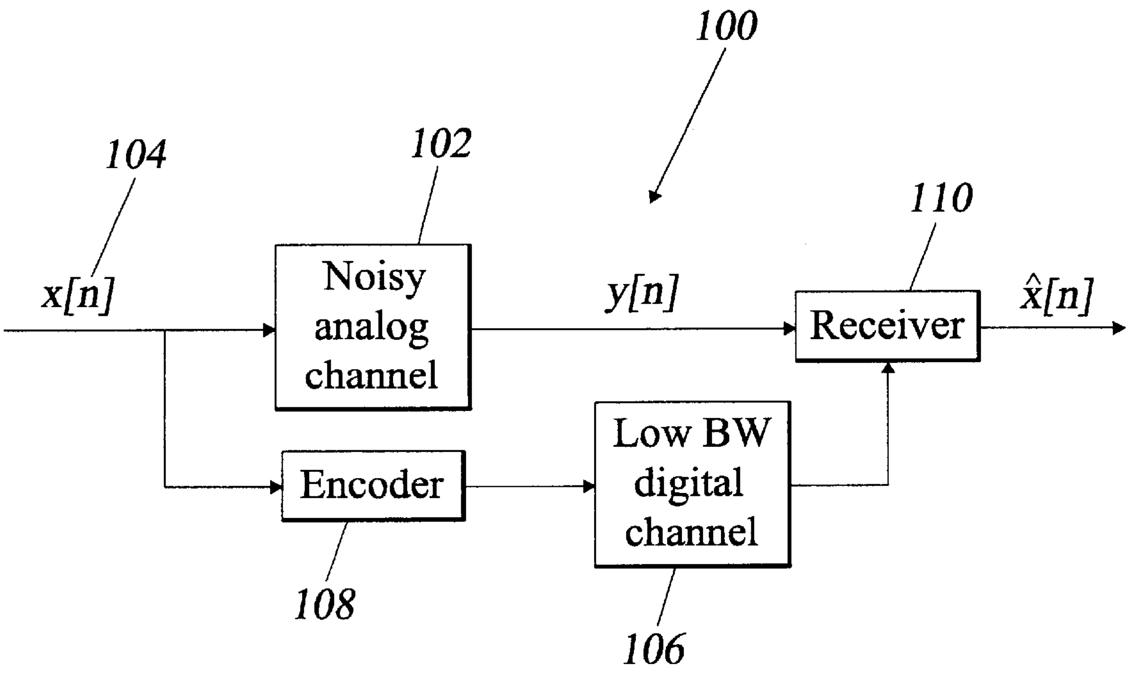
FIG. 1 (PRIOR ART)
FIG. 1 is a schematic block diagram of a hybrid channel model.

In order to achieve coding solutions with low computational complexity, scalar operations are performed on the subband coefficients. The obvious disadvantage of scalar coding is that in general, to achieve a certain distortion level, scalar quantization requires more bits per sample than vector quantization. Or conversely for a prescribed rate, scalar quantization induces more distortion than vector quantization. In an effort to reduce the bit rates required for the invention, postprocessing can be applied to the outputs of the scalar quantizers, as shown in the encoder in FIG. 1.

The optional postprocessing stage, which involves the application of Slepian-Wolf codes, will now be described. Coding gains are achievable over uncoded scalar quantization because several quantized samples are processed together, effectively vectorizing the problem. Clearly these gains are achievable at the expense of an increase in computational complexity to the invention. The grouping of samples can be across subbands and/or across frames. System latency is increased, however, if coding is performed across frames.

The postprocessing of the scalar quantizer outputs is a straightforward application of Slepian-Wolf coding, the theory for which is still in development by many in the research community. A Slepian-Wolf code performs a lossless encoding of the quantizer output, given that there is an observation of a correlated signal (the analog channel output) at the receiver.

In some hybrid source coding scenarios, the desired source-coded bandwidth will be larger than the bandwidth of the analog signal observed at the decoder. For example, an FM radio broadcast has only 15 kHz of bandwidth, whereas CD quality audio requires up to 22 kHz of audio bandwidth. Since a subband decomposition is used to code the signal, bandwidth expansion is straightforward. A subband decomposition is used across the entire bandwidth of the source. The subbands are coded in the bandwidth spanned by the analog signal in a hybrid manner, and the remaining subbands are coded using conventional quantization and reconstruction.

The implementation of the signal coder for the coding of audio at 44.1 kHz sampling rate with observations of the source corrupted by additive white Gaussian noise at the receiver is now described. In a broadcast situation, coding for a worst case SNR will enable proper decoding for all SNRs greater than the worst case value.

The filter bank is implemented by a 2048 sample MDCT/IMDCT operating on data windowed by an integrated Kaiser window at 50% overlap. Each subband coefficient is quantized as described heretofore. Reconstruction from the quantization coefficients requires that the subband energy envelope be communicated to the decoder as side information. A frequency-warped all-pole model is used to describe the spectral envelope with between 20 and 30 poles depending on the source. The frequency warping gives equal emphasis to the spectral components on a Bark frequency scale. The spectral envelope is encoded as log-area ratios that are quantized at 5 bits per coefficient. Thus, the side information uses 4.5–7.0 kb/sec of bandwidth. Reusing the side information, the JND level is calculated using the parametric representation of the spectral envelope. In this implementation, no tonal/noise-like properties are used to calculate the JND, so the masking thresholds are in general more conservative than necessary.

As an evaluation of performance, the audio was coded for transparency assuming 10, 20, and 30 dB SNR observations at the receiver. Several different types of audio were coded, and the ranges of required bit rates for each SNR are shown in the table of FIG. 8. Systematic hybrid audio coders have significant coding gain over coders that ignore the analog signal at the receiver. Preliminary results also suggest that there are similar coding gains for the FM channel.

Although the present invention has been shown and described with respect to several preferred embodiments thereof, various changes, omissions and additions to the form and detail thereof, may be made therein, without departing from the spirit and scope of the invention.

What is claimed is:

1. A systematic hybrid analog/digital encoder which processes data including an analog source signal transmitted on an analog channel and a digital source signal whose digital encoding is transmitted over a digital channel, said digital source signal being a discrete-time sampled signal of said analog source signal, said encoder comprising:

an analysis filter bank which performs a subband decomposition of said digital source signal to generate a plurality of subband source signals;

a quantizer which processes said plurality of subband source signals, based on characteristics associated with said analog channel and the characteristics associated with said digital source signal, to generate a plurality of quantizer output levels represented by a sequence of bits;

a lossless bitstream coder which processes said sequence of bits as a function of said analog channel characteristics and said digital source signal characteristics, to generate an output coded bitstream; and a bitstream formatter which integrates said coded bitstream with supplementary data associated with said subband source signals.

2. The encoder of claim 1, wherein said analysis filter bank comprises a plurality of filters and associated decimators.

3. The encoder of claim 1, wherein said quantizer comprises a plurality of hybrid scalar quantizers, each of which acts on a subband signal.

4. The encoder of claim 3, wherein each hybrid scalar quantizer comprises a modulo element followed by a uniform scalar quantizer.

5. The encoder of claim 4, wherein said modulo element comprises a modulo factor which is a function of average distortion of analog estimation for a given subband source signal.

6. The encoder of claim 5, wherein said uniform scalar quantizer comprises a region of support that is a function of the average distortion of analog estimation for a given subband source signal.

7. The encoder of claim 6, wherein said supplementary data represents said modulo factor and said region of support of said uniform scalar quantizer.

8. The encoder of claim 1, wherein said lossless bitstream coder applies a Slepian-Wolf code to the plurality of quantizer output levels.

9. A method of systematic hybrid analog/digital encoding of data including an analog source signal transmitted on an analog channel and a digital source signal whose digital encoding is transmitted on a digital channel, said digital source signal being a discrete-time sampled signal of said analog source signal, said method comprising:

processing digital source signal with a filter bank to generate a plurality of subband source signals;

quantizing said plurality of subband source signals, based on characteristics associated with said analog channel and characteristics associated with said digital source signal, to generate a plurality of quantizer output levels represented by a sequence of bits;

processing said sequence of bits as a function of said analog channel characteristics and said digital source signal characteristics, to generate an output coded bitstream; and integrating said coded bitstream with supplementary data associated with said subband source signals.

10. A systematic hybrid analog/digital decoder which processes data received from analog and digital channels, said analog channel having an analog output signal related to an analog source signal, and said digital channel having a formatted bitstream derived from a digital source signal, said decoder comprising:

a bitstream interpreter which reads said bitstream and determines a coded bitstream and supplementary data associated with a plurality of subband source signals derived from said digital source signal;

an analog estimator that processes said analog output signal based on characteristics associated with said analog channel and characteristics associated with said digital source signal, to generate a plurality of subband signal estimates;

a bitstream decoder which decodes said coded bitstream based on said analog output signal, characteristics associated with said analog channel, and characteristics associated with said digital source signal, to generate a plurality of quantizer output levels;

a subband signal generator which generates a plurality of reconstructed subband signals based on said subband signal estimates and said quantizer output levels; and a reconstructed source generator which generates a reconstructed digital source signal by processing said reconstructed subband signals with a synthesis filter bank.

11. The decoder of claim 10, wherein said coded bitstream comprises Slepian-Wolf codewords.

12. The decoder of claim 11, wherein said bitstream decoder comprises a Slepian-Wolf bitstream decoder which is a function of said Slepian-Wolf codewords and said analog output signal.

13. The decoder of claim 10, wherein said estimator performs minimum mean-square error estimation of said plurality of subband source signals.

14. The decoder of claim 13, wherein said error estimation is performed by applying an analysis filter bank to generate intermediate subband signals, and by applying linear estimation to each of said intermediate subband signals.

15. The decoder of claim 10, wherein said supplementary data represents modulo factors and regions of support for each subband source signal.

16. The decoder of claim 12, wherein said quantizer output levels define a lattice having points separated by said modulo factors, each reconstructed subband signal being the nearest lattice point to said subband signal estimate.

17. The decoder of claim 10, wherein said synthesis filter bank comprises upsamplers, synthesis filters and a summation of synthesis filter outputs.

18. A method of systematic hybrid analog/digital decoding of data received from analog and digital channels, said analog channel having an analog output signal related to an analog source signal, and said digital channel having a formatted bitstream derived from a digital source signal, said method comprising:

reading said bitstream and determining a coded bitstream and supplementary data associated with a plurality of subband source signals derived from said digital source signal;

processing said analog output signal based on characteristics associated with said analog channel and characteristics associated with said digital source signal, to generate a plurality of subband signal estimates;

decoding said coded bitstream based on said analog output signal, characteristics associated with said analog channel, and characteristics associated with said digital source signal, to generate a plurality of quantizer output levels;

generating a plurality of reconstructed subband signals based on said subband signal estimates and said quantizer output levels; and generating a reconstructed digital source signal by processing said reconstructed subband signals with a synthesis filter bank.

* * * * *